United States Patent
Danjean et al.

(10) Patent No.: US 10,942,655 B2
(45) Date of Patent: Mar. 9, 2021

(54) MITIGATING DATA ERRORS IN A STORAGE DEVICE

(71) Applicant: Seagate Technology LLC, Fremont, CA (US)

(72) Inventors: Ludovic Danjean, Viroflay (FR); Abdelhakim Alhussien, San Jose, CA (US); Sundararajan Sankaranarayanan, Fremont, CA (US); Erich Franz Haratsch, San Jose, CA (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 16/505,909

(22) Filed: Jul. 9, 2019

(65) Prior Publication Data

US 2021/0011631 A1 Jan. 14, 2021

(51) Int. Cl.
*G06F 3/06* (2006.01)
(52) U.S. Cl.
CPC ............ *G06F 3/0619* (2013.01); *G06F 3/064* (2013.01); *G06F 3/0653* (2013.01); *G06F 3/0679* (2013.01)
(58) Field of Classification Search
None
See application file for complete search history.

(56) References Cited

U.S. PATENT DOCUMENTS

| | | | | |
|---|---|---|---|---|
| 9,063,966 B2* | 6/2015 | Patil | | G06F 11/3034 |
| 9,123,445 B2* | 9/2015 | Ellis | | G11C 29/50004 |
| 9,836,349 B2* | 12/2017 | Lien | | G06F 11/1048 |
| 9,857,999 B2* | 1/2018 | Main | | G06F 3/0679 |
| 2011/0141827 A1* | 6/2011 | Mozak | | G11C 11/4099 |
| | | | | 365/189.09 |
| 2012/0002316 A1* | 1/2012 | Sakurai | | G11B 5/455 |
| | | | | 360/31 |
| 2014/0281311 A1* | 9/2014 | Walker | | G06F 12/122 |
| | | | | 711/162 |
| 2019/0172531 A1* | 6/2019 | Lim | | G11C 13/004 |

* cited by examiner

*Primary Examiner* — Elias Mamo
(74) *Attorney, Agent, or Firm* — Taylor English Duma LLP

(57) ABSTRACT

Systems and methods presented herein provide for mitigating errors in a storage device. In one embodiment, a storage system includes a storage device comprising a plurality of storage areas operable to store data, and a controller operable to evaluate operating conditions of the storage device, to perform a background scan on a first of the storage areas to characterize a read retention of the first storage area, and to adjust a read signal of the first storage area based on the characterized read retention and the operating conditions of the storage device.

17 Claims, 13 Drawing Sheets

MITIGATING DATA ERRORS IN A STORAGE DEVICE

SUMMARY

Systems and methods presented herein provide for mitigating data errors in a storage device. In one embodiment, a storage system includes a storage device comprising a plurality of storage areas operable to store data, and a controller operable to evaluate operating conditions of the storage device, to perform a background scan on a first of the storage areas to characterize a read retention of the first storage area, and to adjust a read signal of the first storage area based on the characterized read retention and the operating conditions of the storage device.

The various embodiments disclosed herein may be implemented in a variety of ways as a matter of design choice. For example, the system and method embodiments hereof may take the form of computer hardware, software, firmware, or combinations thereof. Other exemplary embodiments are described below.

BRIEF DESCRIPTION OF THE FIGURES

Some embodiments are now described, by way of example only, and with reference to the accompanying drawings. The same reference number represents the same element or the same type of element on all drawings.

DETAILED DESCRIPTION OF THE FIGURES

The figures and the following description illustrate specific exemplary embodiments. It will thus be appreciated that those skilled in the art will be able to devise various arrangements that, although not explicitly described or shown herein, embody certain principles that are included within the scope of the embodiments. Furthermore, any examples described herein are intended to aid in understanding the principles of the embodiments and are to be construed as being without limitation to such specifically recited examples and conditions. As a result, the embodiments are not limited to any specific examples described below.

Figure 1:
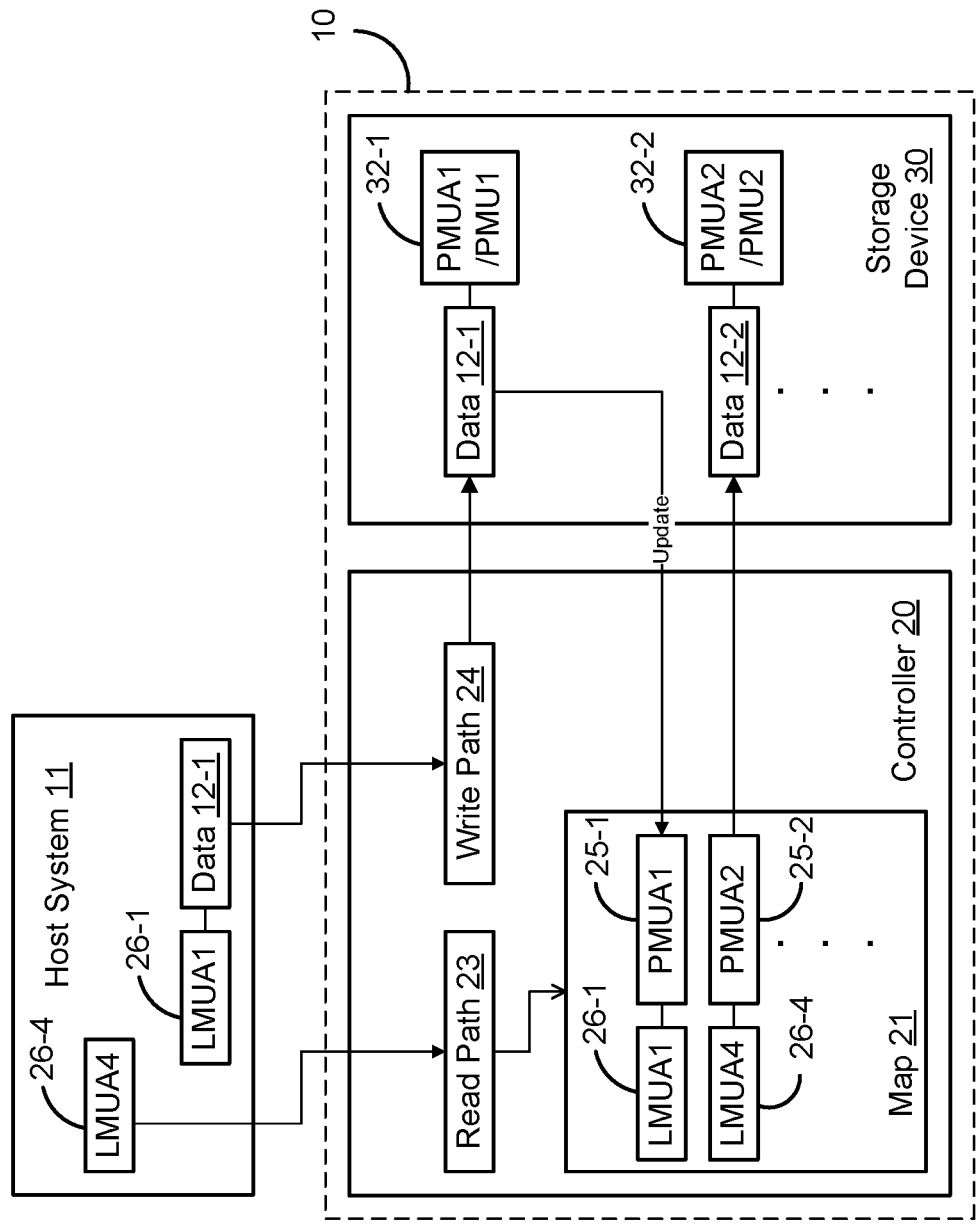
FIG. 1 is a block diagram of an exemplary storage system.

FIG. 1 is a block diagram of an exemplary storage system 10 that is operable to store and read data 12 resulting from Input/Output (I/O) requests by a host system 11. The storage system 10 comprises a controller 20 that controls how and where the data 12 is persistently stored on a storage device 30. The controller 20 employs a map 21 that maps data 12 to and from the storage device 30. For example, the host 11 system maintains an address list of logical mapping units (LMUs) where data is stored and where data is to be written. These LMUs, however, are not the actual locations of the data 12 in the storage device 30. Rather, logical mapping unit addresses (LMUAs) 26 of the address list are used to link to physical mapping unit addresses (PMUAs) 25 in the map 21 as the controller 20 maintains control over where data 12 is stored and where data 12 is to be written in the storage device 30. This is due to the fact that the controller 20 may need to perform certain operations on the data 12 from time to time. So, the controller 20 maintains the map 21 that links the LMUAs 26 of the data 12 to their corresponding PMUAs 25 of the storage device 30, thereby abstracting the physical mapping units (PMUs) of the storage device 30 from the host system 11.

Thus, when the host system 11 needs to read data from the storage device 30, the host system 11 configures a read I/O request that includes an LMUA 26. The host system 11 transfers the read I/O request to the controller 20 where the I/O request goes through a read path 23 to extract the LMUA 26 from the I/O request. The controller 20 processes the LMUA 26 via the map 21 to identify the PMUA 25 of the data 12. In other words, the controller 20 translates the LMUA 26 from the host system 11 to the PMUA 25 using the map 21 to identify which PMU 32 of the storage device 30 is storing the data. The controller 20 may then use the PMUA 25 to retrieve the data 12 from the PMU 32 of the storage device 30 and return it to the host system 11.

Similarly, when the host system 11 needs to write data to the storage device 30, the host system 11 configures a write I/O request that includes a LMUA 26 and the data 12 to be written to the storage device 30. The host system 11 transfers the write I/O request to the controller 20 where the I/O request goes through a write path 24 to extract the LMUA 26 and the data 12 from the I/O request. The controller 20 may then process the LMUA 26 and write the data 12 to a PMU 32 of the storage device 30 with a certain address PMUA 25. Once the data is stored, the storage device 30 reports the PMU 32 to the controller 20, which in turn updates the map 21 to link the LMUA 26 to the appropriate PMUA 25 of the PMU 32.

These processes may be used in a variety of storage device types, such as hard disk drives (HDDs) and SSDs. SSDs (e.g., NAND flash devices including multi-dimensional NAND flash devices, such as a three-dimensional (3D) NAND flash devices and the like) do not use the moving mechanical components that an HDD does. Instead, these storage devices use integrated circuitry as memory cells to persistently store data. The memory cells are arranged in "pages", which are arranged in "blocks". And, the blocks are arranged on a "plane" of a die. The controller 20 in such a case writes data to the pages of the blocks and manages how and where that data is stored and changed via subsequent I/O requests.

Figure 2:
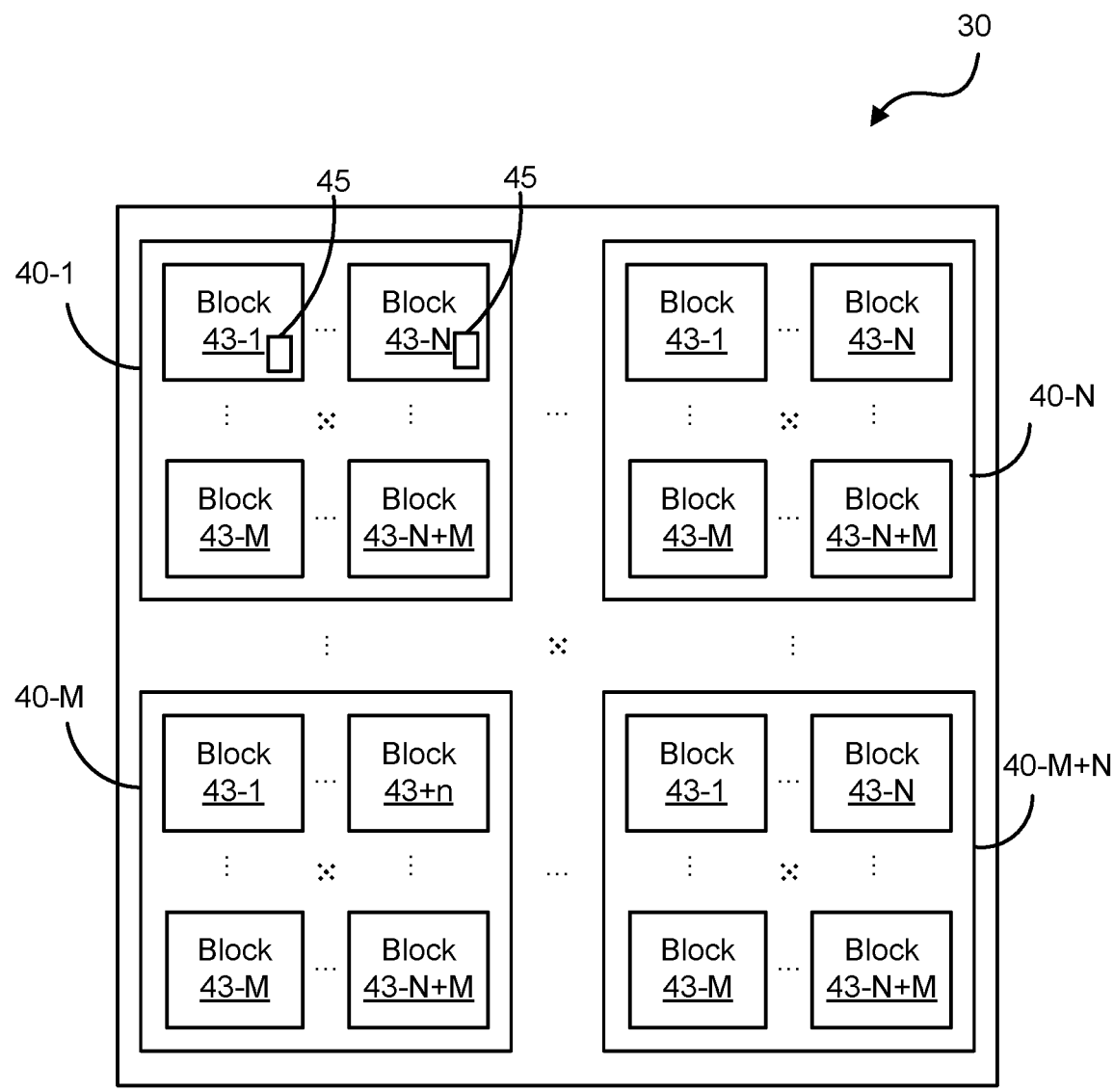
FIG. 2 is a block diagram of a storage device in one exemplary Solid State Drive (SSD) embodiment.

FIG. 2 is a block diagram of the storage device 30 in one exemplary SSD embodiment. In this embodiment, the storage device 30 includes a plurality of dies 40-1-40-M+N, each of which may include a plurality of data blocks 43-1-43-M+N (where "M" and "N" are integers greater than "1" and not necessarily equal to each other or other "M" or "N" references herein). And, each block 43 may include a plurality of pages 45 where data is stored (only a few of which are shown for simplicity).

In some embodiments, the storage device 30 may be configured using one or more SSD architectures, such as Single Level Cell (SLC) architectures and Multi-Level Cell (MLC) architectures. An SLC architecture allows a memory cell to store one bit of data. Traditionally, an MLC architecture meant that a memory cell could store two bits of data. But, architectures have evolved and now provide even higher levels of density, such as Triple Level Cell (TLC) architectures that store three bits per memory cell, and Quad Level Cell (QLC) architectures that store four bits per memory cell. Generally though, any architecture storing more than one bit of data per cell may also be referred to as an MLC architecture.

Other examples of the storage device 30 include magnetic recording devices, such as shingled magnetic recording (SMR) mediums where tracks are "shingled" upon one another to increase data storage capacity. For example, a write head of an SMR drive overlaps tracks of a magnetic recording of the SMR drive. Thus, when writing to one track of the SMR drive, the write head may disturb the data of an adjacent track. So, the SMR drive marks the disturbed data as invalid and performs a sort of "garbage collection" on those tracks, similar to an SSD. Still, other examples of the storage device 30 include phase-change memory, resistive Random Access Memory (RAM), magnetoresistive storage devices (e.g., such as magnetoresistive RAM, or "MRAM", Spin-Transfer Torque MRAM, or "STT-MRAM", etc.), and various combinations of the examples herein.

As used herein garbage collection is a process where data is written to and erased from the storage device 30 in units. For example, in some embodiments, the storage device 30 may only be erased in larger units. If the data in some of the smaller units is no longer needed (e.g., stale data), only the units with good data may be read and rewritten into another previously erased area.

It should be noted that, while the I/O requests can and often do come directly from a host system, the I/O requests may be cached in another device, such as a buffer, before being executed by the controller 20, or may even be issued by other storage devices themselves. Accordingly, the embodiment is not intended to be limited to any particular type of I/O request. Based on the foregoing, the controller 20 is any device, system, software, firmware, or combination thereof operable to service I/O requests to read data from and write data to the storage device 30 and to maintain the integrity of the data in the storage device 30.

In maintaining the integrity of the data in the storage device 30, the controller 20 may perform certain operations in the background. For example, the controller 20 may perform scans of certain portions of the storage device 30 while the controller 20 is processing I/O requests to other portions of the storage device 30. Examples of these operations include data deduplication operations, garbage collection operations, device degradation tests, data degradation tests, command suspensions, and the like. Examples of data degradation tests include read retention tests, such as first read effect tests, quick charge loss tests, short-term data retention tests, low temperature data retention (LTDR) tests, cross temperature tests, and the like.

A first read effect is an error phenomenon that occurs when data is not read from the storage device 30 often enough. For example, when a nonvolatile memory block of an SSD is programmed and the block is not read often or quick enough after programming (e.g., writing), the block is likely to experience a higher failed bit count than subsequent reads. Accordingly, the controller 20 may perform a background read on the block after some threshold time period once data is written to the block (or some portion of the block).

Quick charge loss, short-term data retention, and LTDR are error phenomena that also occur after programming a nonvolatile memory block of an SSD. For example, once the block is programmed, charge leakage can be observed through the tunnel oxide impacting voltage distribution and optimal read threshold voltages, Vrefs. This problem may settle within minutes but can depend on the media type, the media generation, and/or the operating conditions of the storage device 30 (e.g., operating temperature, program erase cycles (PECs), read disturb counts etc.).

Cross temperature is an error phenomenon that generally occurs based on different reading and writing temperatures. For example, if the nonvolatile memory block of an SSD is programmed at one temperature and read at another, the bit error rate may increase, in some cases significantly.

Figure 3:
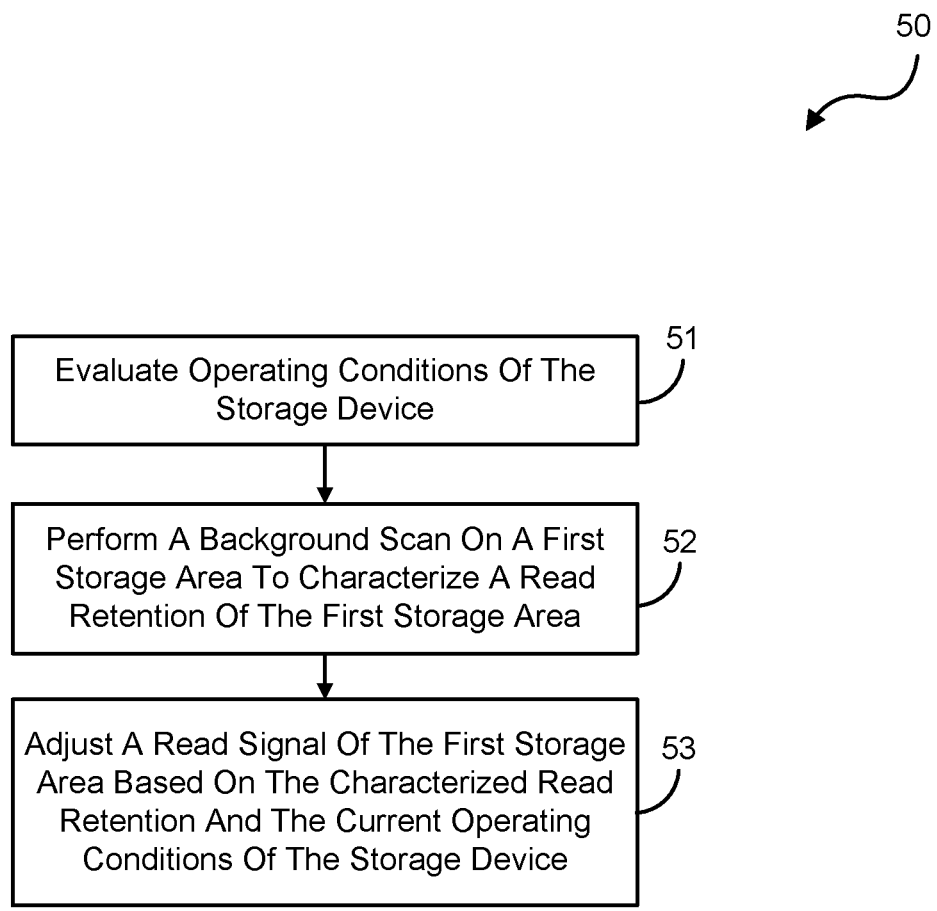
FIG. 3 is a flowchart of an exemplary process of the storage system.

To overcome these error phenomena, the controller 20 may perform one or more background operations. In this regard, FIG. 3 is a flowchart of a process 50 that may be implemented by the controller 20. In this embodiment, the controller 20 may evaluate the operating conditions of the storage device 30, in the process element 51. For example, the controller 20 may determine, among other things, the current operating temperature of the storage device 30, PECs of storage areas of the storage device 30 (e.g., blocks), a number of read disturbs in portions of the storage device 30, etc. Thereafter, the controller 20 may perform a background scan on a first storage area of the storage device 30, in the process element 52, to characterize a read retention of the first storage area. For example, the controller 20 may perform a first read effect test on all or a portion of the storage device 30 to mitigate errors associated with a first read after writing to the storage device 30. In some embodiments, the storage device 30 is an SSD (e.g., a 3D NAND flash). In this regard, the controller 20 may perform a first read on one or more pages within one or more blocks after some threshold duration once the one or more pages have been written to. This first read may produce a substantially higher bit error rate than a subsequent read, essentially "knocking down" the bit error rate for subsequent reads and providing a baseline characterization of the read retention of the storage device 30.

The controller 20 may also scan (i.e., in the background) one or more blocks of the storage device 30 to determine whether one or more read signals (e.g., Vrefs) should be adjusted based on characterized read retention of the storage device 30 and/or the operating conditions of the storage device 30. The controller 20 then adjusts at least one read signal of at least one storage area of the storage device based on the characterized read retention and the operating conditions of storage device 30, in the process element 53. Embodiments of the read retention characterization and the background scans are shown and described in greater detail below.

Figure 4:
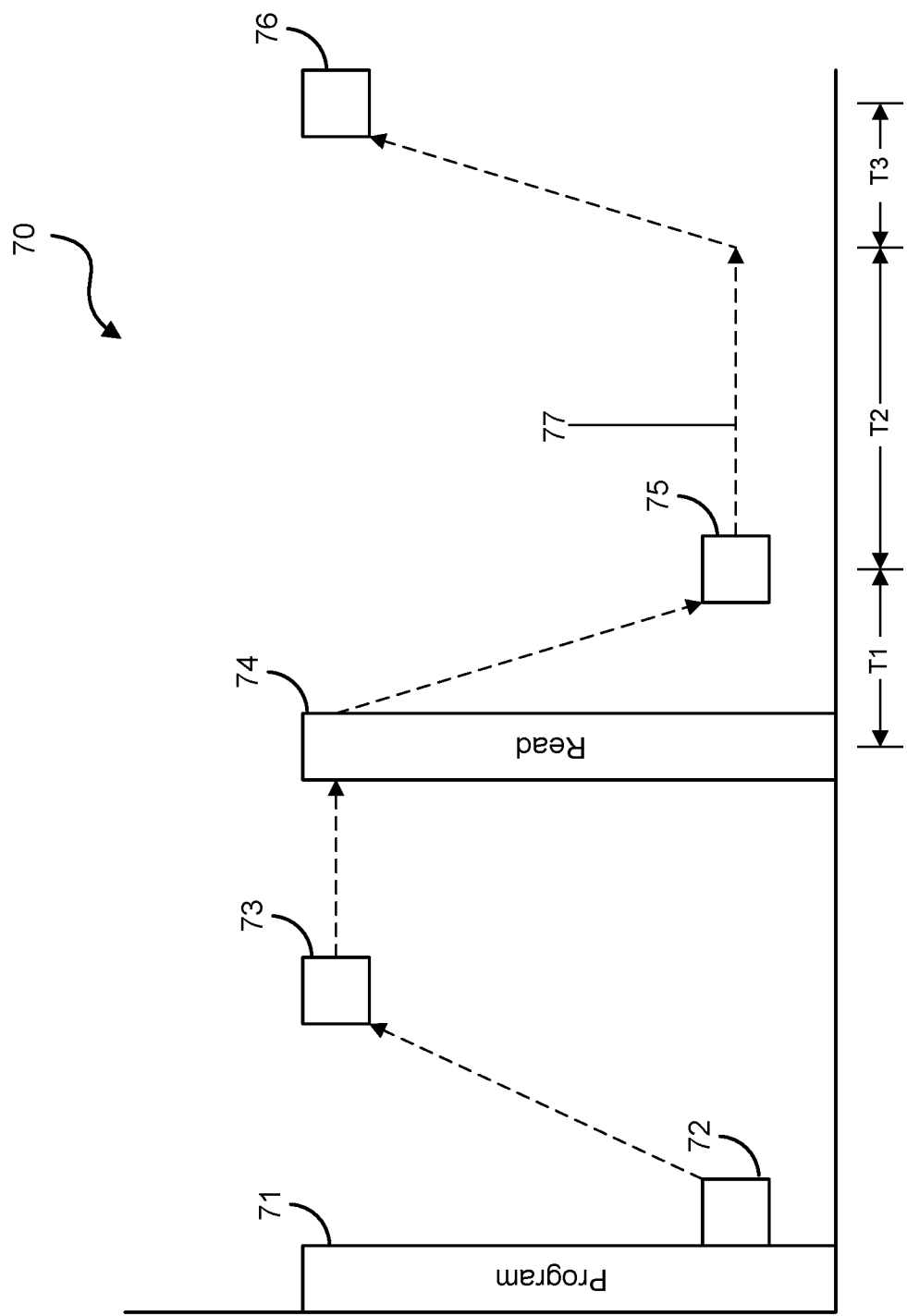
FIG. 4 is a timing diagram of an exemplary first read effect test.

FIG. 4 is a timing diagram 70 of an exemplary first read effect test. This process may be performed as part of a background scan to mitigate an initial bit error rate for at least a portion of the storage device 30, thereby providing at least a partial read retention characterization of the storage device 30. To illustrate, the controller 20 may program at least one page of the storage device 30 at step 71 of the timing diagram 70. At this time, the bit error rate associated with any read at the point 72 would be relatively low.

However, over time, the bit error rate increases at the point 73 as no read has been performed on the page of the storage device 30. To reduce the bit error rate, the controller 20 performs a read operation 74 on the page such that the bit error rate reduces at the point 75 over time T1. The bit error rate may remain the same as point 75 for some duration of time T2. However, if the page has not been read for some period after the time T2, the bit error rate may again increase to the point 76 over the course of time T3. Accordingly, the controller 20 may monitor the page of the storage device 30 to determine how much time has elapsed between previous reads and provide a threshold time 77 to read the page to ensure that the bit error rate does not increase to the point 76.

It should be noted that the controller 20 may implement such a first read effect test on any type of storage device where degradation of data can occur over time and be mitigated with a read operation. It should also be noted that the first read effect test may be performed as part of a background scan that also implements an RTTC and/or a TTC on any portion of the storage device 30 including but not limited to pages, blocks (e.g., rblocks), dies, etc.

Figure 5:
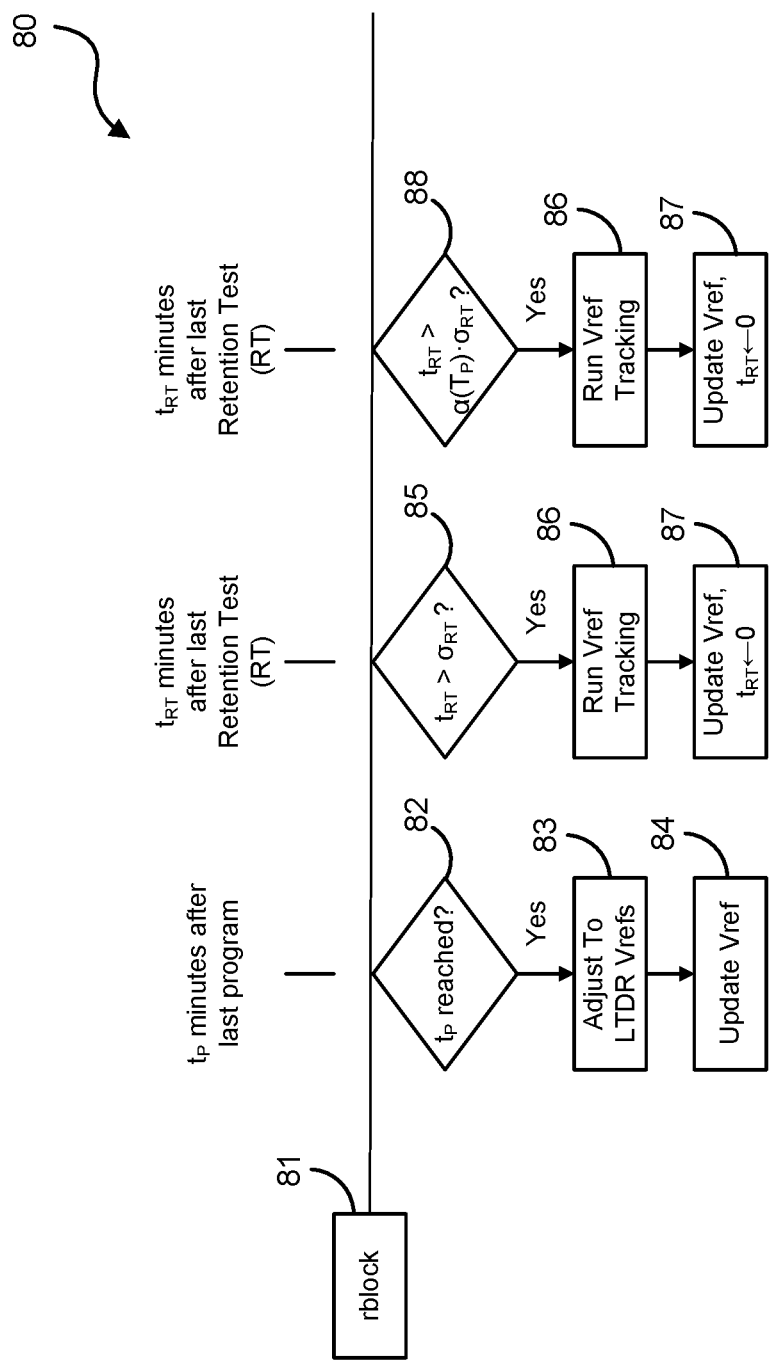
FIG. 5 is a flow diagram of an exemplary background scan with proactive read threshold voltage (Vref) adjustment associated with quick-charge loss, short term data retention, and/or Low Temperature Data Retention (LTDR).

FIG. 5 is a flow diagram of an exemplary background scan 80 with proactive Vref adjustment associated with quick-charge loss, short term data retention, and/or LTDR. Some Vref shifts over time can be characterized by flash type as a function of PEC (e.g., in a NAND flash version of the storage device 30), operating temperature, read disturb counts, etc. Here, the controller 20 may proactively adjust Vrefs based on a time since a block of the storage device 30 was last programmed and/or based on a time since the Vrefs were last adjusted. This may be performed in conjunction with the first read effect test. In some embodiments, the background scan may "wake up" to initially mitigate the first read effect. The controller 20 may then check a time ($t_P$) that a given rblock (a.k.a., a garbage collection unit or "GCU") was last programmed and/or a time that the Vrefs for the rblock were last adjusted.

When starting to check a new set of blocks on which Vrefs are adjusted together, the controller 20 may perform a background scan that checks for a test condition and subsequently applies new "on-the-fly" Vrefs if the Vrefs for the test condition are known (through characterization for example). Alternatively or additionally, the controller 20 may trigger an adaptive Vref tracking routine to compute new Vrefs. Examples of each are shown or described in greater detail below.

With this in mind, the controller 20 may select an rblock at flow point 81 and check whether the rblock has reached the time, $t_P$ (e.g., the time as the last program) in the process element 82. If so, the controller 20 may adjust the Vrefs of the rblock to its LTDR levels, in the process element 83, and then update the Vref, in the process element 84, for subsequent reads. Otherwise, the controller 20 determines whether the rblock has reached a retention test time, $t_{RT}$, in the process element 85. In doing so, the controller 20 may compare the $t_{RT}$ of the rblock to a programmable threshold $\sigma_{RT}$. For example, based on a data retention characterization of the storage device 30, the controller 20 may establish threshold times for the rblocks of the storage device 30, either independently or collectively. If the rblock under evaluation has its $t_{RT}$ greater than the programmable threshold $\sigma_{RT}$, the controller 20 may initiate an adaptive Vref tracking routine to compute the new Vrefs as part of an RTTC, in the process element 86. Examples of adaptive Vref tracking can be found in commonly owned U.S. Pat. No. 9,645,763, U.S. Pre-Grant Publication No. 2019/0122726, and U.S. Pre-Grant Publication No. 2015/0092489, the contents of which are hereby incorporated by reference.

Then, the controller 20 updates the Vref of the rblock and resets the $t_{RT}$ of the rblock to zero, in the process element 87. The process elements 85 through 87 may be repeated as long as data is stored in this rblock to ensure longer data retention can be handled by the rblock and so that Vrefs of the rblock do not drift much without adjustment.

For subsequent RTTCs, the RTTC can also be coupled with a factor α which may depend on the time, $t_P$, of the rblock and/or the number times the adaptive Vref tracking has been initiated on the rblock. For example, in the process element 88, the controller may determine whether the $t_{RT}$ of the rblock is greater than some multiple of the time $t_P$ in which the rblock was last programmed multiplied by the programmable threshold $\sigma_{RT}$. If so, the controller 20 may run the adaptive Vref tracking, in the process element 86, and then update the Vref of the rblock and reset the $t_{RT}$ of the rblock to zero, in the process element 87. If the rblock under evaluation has not passed its $t_{RT}$, the controller 20 may select another rblock for evaluation and perform background scan on the other rblock.

Figure 6:
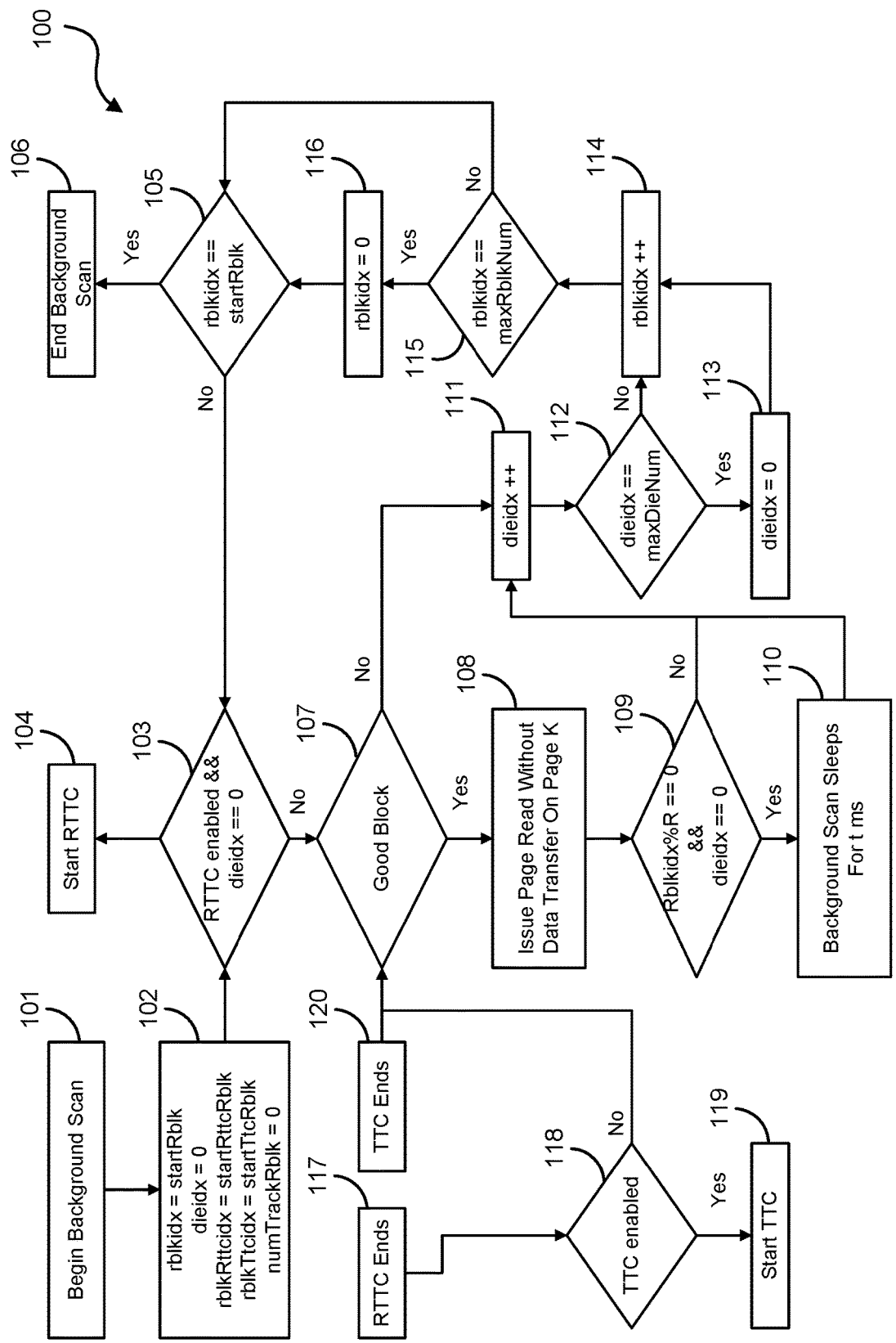
FIG. 6 is a flowchart of a process of an exemplary background scan that may be used to start a retention test time check (RTTC) and/or a temperature test check (TTC).

FIG. 6 is a flowchart of a process 100 of an exemplary background scan that may be used to start an RTTC and/or a temperature test check (TTC). In this embodiment, the controller 20 initiates a background scan in the process element 101. As part of this background scan initiation, the controller 20 may initialize the background scan to ensure that each rblock is evaluated, in the process element 102. For example, an rblock index, rblkidx, may be initialized to a randomly generated startRblk value in the first die of the storage device 30 (having a die index, dieidx, equal to zero). The rblock's RTTC index, rblkRttcidx, may be initialized to a startRttcRblk value, and the rblock's TTC index, rblkTtcidx, may be initialized to a startTtcRblk value. And, the number of rblocks tracked during the background scan, numTrackRblk, may be initialized to zero.

If the RTTC is enabled and the die index, dieidx, is equal to zero, in the process element 103, the controller 20 may begin the RTTC, in the process element 104. One example of the RTTC is shown and described below in FIG. 7. Once the RTTC ends, in the process element 117, the controller 20 may determine whether the TTC has been enabled, in the process element 118. If so, the controller 20 starts the TTC, in the process element 119. One example of the TTC is shown and described below in FIG. 9. Once the TTC ends, in the process element 120, or the TTC has not been enabled (process element 118), the controller 20 determines whether the rblock being evaluated is a "good block", in the process element 107. For example, the controller 20 may determine whether the rblock under evaluation is not undergoing a PEC, has been erased, has been retired (e.g., a bad block), etc.

If the rblock is good, the controller 20 may issue a page read without data transfer on page index", in the process element 108, where "K" is a non-negative integer representing an index to the pages of the rblock under evaluation. For example, the controller 20 may check data of a page in the rblock under evaluation by reading the page without transferring the data, as would typically occur with a read I/O request. This may reduce unnecessary flash interference activities. If the rblock under evaluation is not a good block (i.e. process element 107), then the controller 20 has no need to test the block and may therefore increment the die index, dieidx, to move onto the next die, in the process element 111.

From there, the controller 20 may determine whether the Rblkidx % R equals zero and the die index, dieidx, equals zero, in the process element 109. The Rblkidx % R is generally a value that tells the controller 20 how often the background scan is put to sleep such that other tasks (e.g., I/O operations, garbage collections, etc.) may run. If the conditions are met, the controller 20 may put the background scan to sleep for a programmable time, t (generally in milliseconds), in the process element 110. Then, the controller 20 may increment the die index, dieidx, and move onto the next die, in the process element 111. If the conditions are not met, the controller 20 may increment the die index, dieidx, and move onto the next die, in the process element 111, regardless.

The controller 20 may then determine whether the die index, dieidx, has reached the maximum number of dies, maxDieNum, in the storage device 30, in the process element 112. If the controller 20 has reached the maximum number of dies in the storage device 30, the controller 20 resets the die index, dieidx, to zero, in the process element 113, such that the background scan can start anew (e.g., continue on the next rblock). For example, if all the dies have been tested, the background scan can restart at the original starting block of the original starting die. If the controller 20 determines that the maximum number of dies in the storage device 30 has not been reached, the controller 20 may increment the rblock index, rblkidx, in the process element 114, to move onto the next rblock in the die. Similarly, the controller 20 may increment the rblock index, rblkidx, in the process element 114, when the controller 20 has reached the maximum number of dies in the storage device 30 as the die index has been reset to zero for when the background scan begins anew (e.g., continue on the next rblock of the next die).

After the rblock index, rblkidx, has been incremented, the controller 20 may determine whether the rblock index, rblkidx, has reached a maximum number of rblocks, maxRblkNum, in the die, in the process element 115. If not, the controller 20 may determine whether the rblock index, rblkidx, equals the randomly generated startRblk value, in the process element 105. If the rblock index, rblkidx, equals the startRblk value, the controller 20 has performed the background scan on each of the rblocks in the storage device 30 and can end the background scan, in the process element 106. If the rblock index, rblkidx, does not equal the startRblk value, then the controller 20 has more rblocks to evaluate on the storage device 30 and returns to process element 103 to determine whether the RTTC is enabled and the die index, dieidx, is equal to zero to determine whether to start the RTTC. If, however, the rblock index, rblkidx, has reached a maximum number of rblocks, maxRblkNum, in the die, in the process element 115, the controller 20 may set the rblock index, rblkidx, to zero such that the background scan can start anew on the die (e.g., continue on the next rblock), in the process element 116.

Figure 7:
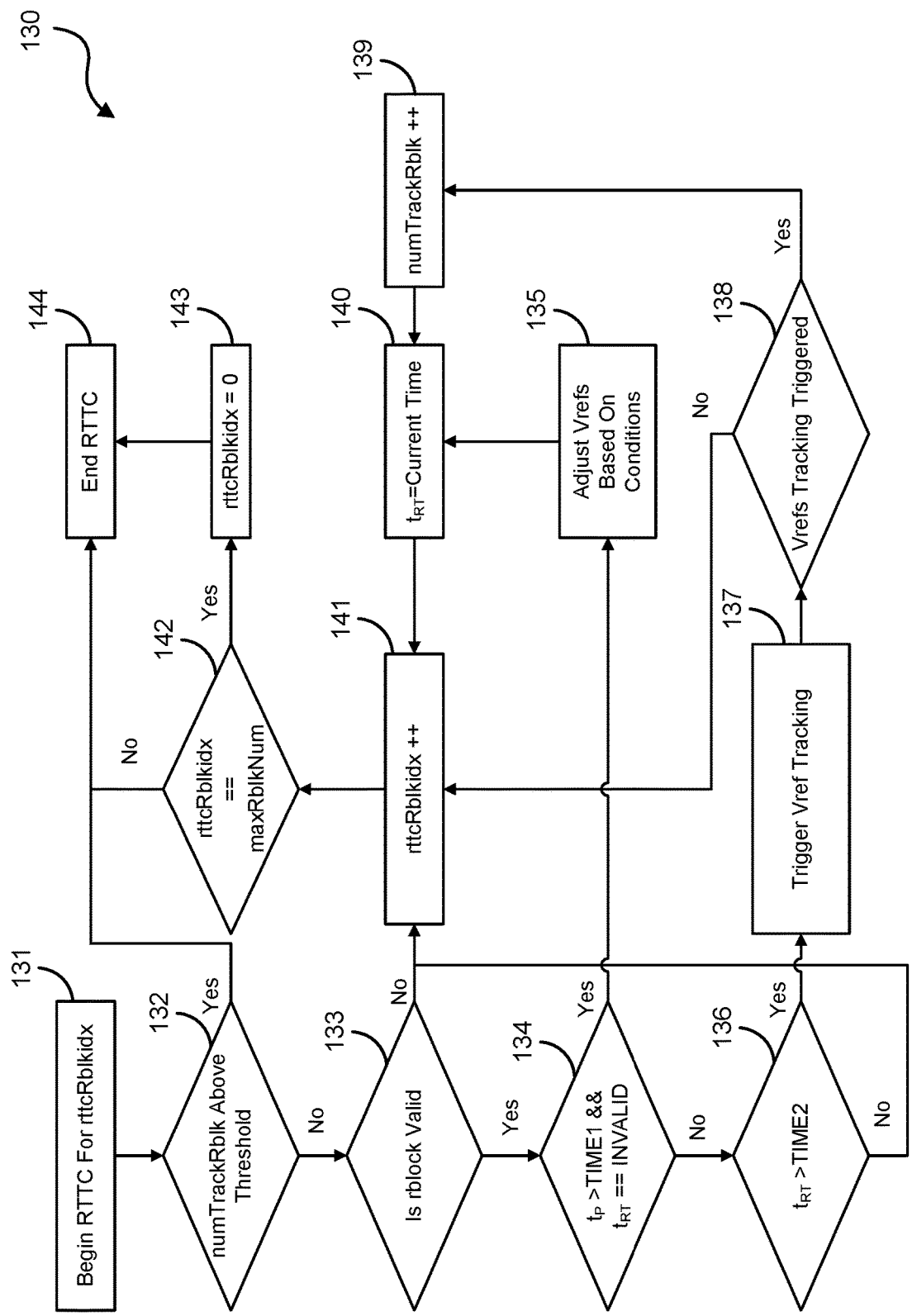
FIG. 7 is a flowchart of a process of an exemplary RTTC background scan.

FIG. 7 is a flowchart of a process 130 of an exemplary RTTC background scan. The process 130 may be used to operate on one rblock at a time once initiated by the process 100 of FIG. 6 (e.g., in the process element 104). In this embodiment, the controller 20 initiates the RTTC for the indexed rblock, rttcRblkidx, in the process element 131. Once initiated, the controller 20 may determine whether the number of rblocks tracked, numTrackRblk, during the background scan is above a certain threshold, in the process element 132. This numTrackRblk threshold may be used to limit the number of background activities being performed. For example, if the numTrackRblk value is above the threshold, the controller 20 may decide to end the RTTC, in the process element 143, such that other background activities can be performed.

If the numTrackRblk value is below the threshold, the controller 20 may determine whether the rblock is valid, in the process element 133. For example, the controller 20 may determine whether the rblock under evaluation is not undergoing a PEC, has been erased, has been retired (e.g., a bad block), etc. If the rblock is not valid, the controller 20 may skip the rblock and increment the RTTC index of the rblock, rttcRblkidx, in the process element 141. If, however, the rblock is valid, then the controller 20 may determine whether the time, $t_p$, that the rblock was last programmed has breached a threshold time, TIME1, and whether the retention test time, $t_{RT}$, of the rblock is invalid, in the process element 134. For example, the time, TIME1, may represent the time after the programming threshold (e.g., $\sigma_p$). If these conditions are met, the controller 20 may adjust the Vrefs of the rblock under evaluation based on the operating conditions of the storage device 30, in the process element 135. Otherwise, the controller 20 may determine whether the retention test time, $t_{RT}$, of the rblock has breached a threshold time, TIME2, which may represent the time between two Vref adjustments (e.g., $\alpha(t_P)*\sigma_{RT}$), in the process element 136.

If the retention test time, $t_{RT}$, of the rblock has not breached the threshold time, TIME2, then there is no reason to perform the RTTC background scan on that particular rblock. Accordingly, the controller 20 may increment the RTTC index of the rblock, rttcRblkidx, in the process element 141, to move onto the next rblock. Otherwise, the controller 20 may trigger the adaptive Vref tracking, in the process element 137. For example, the adaptive Vref tracking may depend on a hardware and/or a firmware architecture. In some embodiments, such as with multiple central processing units (CPUs), there may not be enough resources to run Vref tracking at any given time (e.g., when buffers are full, when the host needs bandwidth, etc.). Accordingly, the controller 20 may issue "a non-blocking call" that essentially runs the adaptive Vref tracking when possible. If the adaptive Vref tracking cannot be performed at the current time, the controller 20 may return to the adaptive Vref tracking at some later point in time (e.g., on the next scan) such that the adaptive Vref tracking does not impact performance (e.g., by ensuring that it is kept in the background). Thus, the controller 20 may determine whether Vref tracking has been triggered, in the process element 138. If so, the controller 20 increments the number of rblocks being tracked, numTrackRblk, in the process element 139.

Once the Vrefs have been adjusted based on the operating conditions, in the process element 135, or the number of rblocks being tracked, numTrackRblk, has been incremented, the controller 20 may set the retention test time, $t_{RT}$, of the rblock as the current time, in the process element 140, and increment the RTTC index of the rblock, rttcRblkidx, in the process element 141. The controller 20 may then determine whether the RTTC index of the rblock, rttcRblkidx, has reached the maximum number of rblocks, maxRblkNum, in the die, in the process element 142. If so, the controller 20 may set the RTTC index of the rblock, rttcRblkidx, to zero, in the process element 143, such that the RTTC process 130 can begin anew (e.g., continue on the next rblock). In this regard, the controller 20 may end the RTTC, in the process element 144 until the RTTC process is started again. If the controller 20 determines that the RTTC index of the rblock, rttcRblkidx, has not reached the maximum number of rblocks, maxRblkNum, in the die, in the process element 142, the controller 20 may end the RTTC, in the process element 144 regardless.

Figure 8:
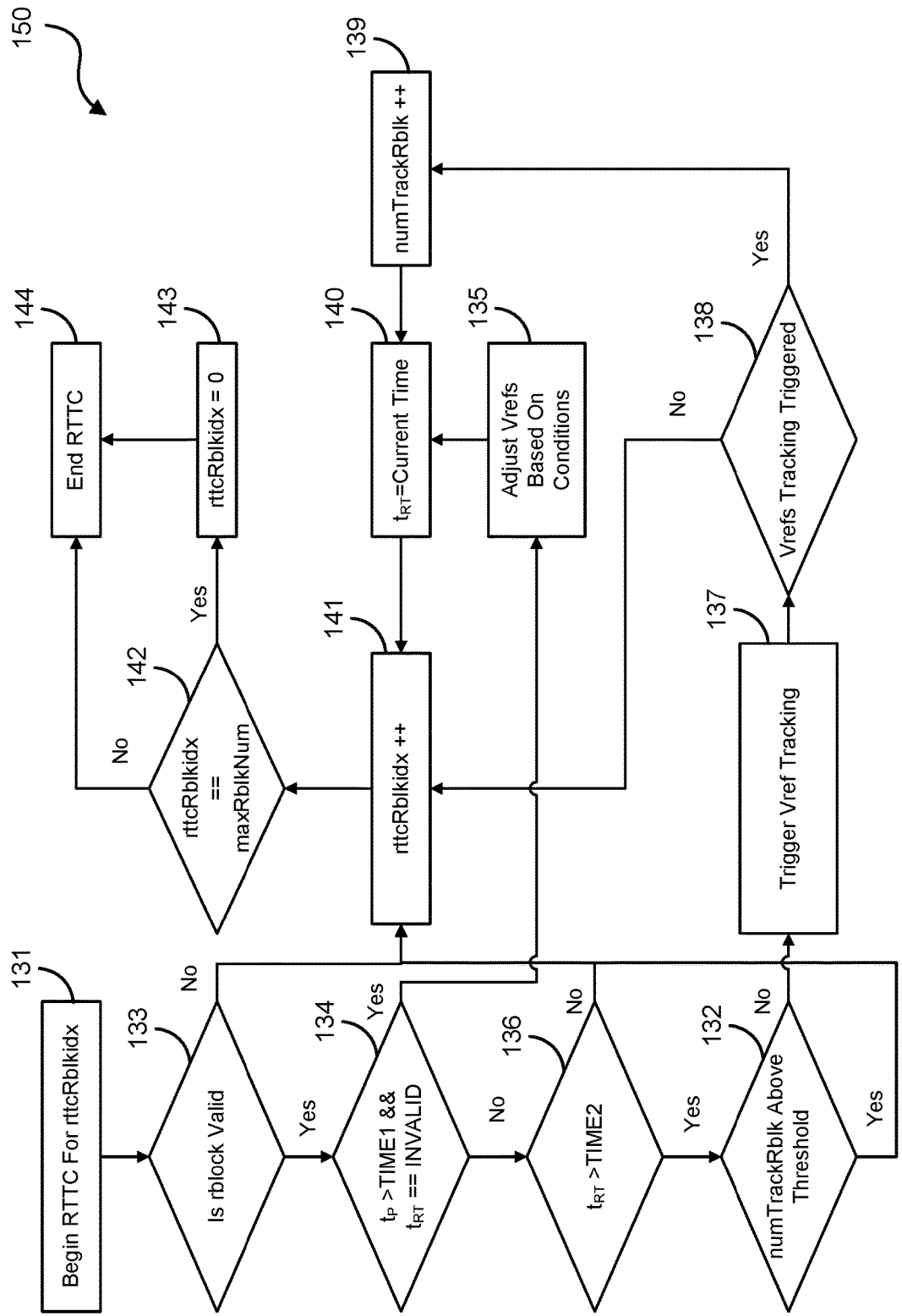
FIG. 8 is a flowchart of a process of another exemplary RTTC background scan.

FIG. 8 is a flowchart of a process 150 of another exemplary RTTC background scan. In this RTTC background scan embodiment, certain process elements are performed in an alternative manner. More specifically, the controller 20 implements the process elements 132, 133, 134, and 136 in a different order. The controller 20 again initiates the RTTC for the indexed rblock, rttcRblkidx, in the process element 131. Once initiated, the controller 20 may determine whether the rblock is valid, in the process element 133. For example, the controller 20 may determine whether the rblock under evaluation is not undergoing a PEC, has been erased, has been retired (e.g., a bad block), etc. If the rblock is not valid, the controller 20 may skip the rblock and increment the RTTC index of the rblock, rttcRblkidx, in the process element 141. If, however, the rblock is valid, then the controller 20 may determine whether the time, $t_P$, that the rblock was last programmed has breached a threshold time, TIME1, and whether the retention test time, $t_{RT}$, of the rblock is invalid, in the process element 134. Again, the time, TIME1, may represent the time after the programming threshold (e.g., $\sigma_p$). If these conditions are met, the controller 20 may adjust the Vrefs of the rblock under evaluation based on the operating conditions of the storage device 30, in the process element 135.

If these conditions are not met, the controller 20 may determine whether the retention test time, $t_{RT}$, of the rblock has breached a threshold time, TIME2, which again may represent the time between two Vref adjustments (e.g., $\alpha(t_P)*\sigma_{RT}$), in the process element 136. If the retention test time, $t_{RT}$, of the rblock has not breached the threshold time, TIME2, then there is no reason to perform the RTTC background scan on that particular rblock. Accordingly, the controller 20 may increment the RTTC index of the rblock, rttcRblkidx, in the process element 141, to move onto the next rblock.

From there, the controller 20 may determine whether the number of rblocks tracked, numTrackRblk, during the background scan is above a certain threshold, in the process element 132. Again, the numTrackRblk threshold may be used to limit the number of background activities being performed such that other background activities can be performed. If the numTrackRblk value is above the threshold, the controller 20 may increment the RTTC index of the rblock, rttcRblkidx, in the process element 141. Otherwise, the controller 20 may trigger the adaptive Vref tracking, in the process element 137. From there, the controller 20 may determine whether Vref tracking has been triggered, in the process element 138, for reasons explained above. If so, the controller 20 increments the number of rblocks being tracked, numTrackRblk, in the process element 139.

Once the Vrefs have been adjusted based on the operating conditions, in the process element 135, or the number of rblocks being tracked, numTrackRblk, has been incremented, the controller 20 may set the retention test time, $t_{RT}$, of the rblock as the current time, in the process element 140, and increment the RTTC index of the rblock, rttcRblkidx, in the process element 141. The controller 20 may then determine whether the RTTC index of the rblock, rttcRblkidx, has reached the maximum number of rblocks, maxRblkNum, in the die, in the process element 142. If so, the controller 20 may set the RTTC index of the rblock, rttcRblkidx, to zero, in the process element 143, such that the RTTC process 130 can begin anew (e.g., from the original starting place of the previous RTTC). In this regard, the controller 20 may end the RTTC, in the process element 144 until the RTTC process is started again. If the controller 20 determines that the RTTC index of the rblock, rttcRblkidx, has not reached the maximum number of rblocks, maxRblkNum, in the die, in the process element 142, the controller 20 may end the RTTC, in the process element 144 regardless.

Figure 9:
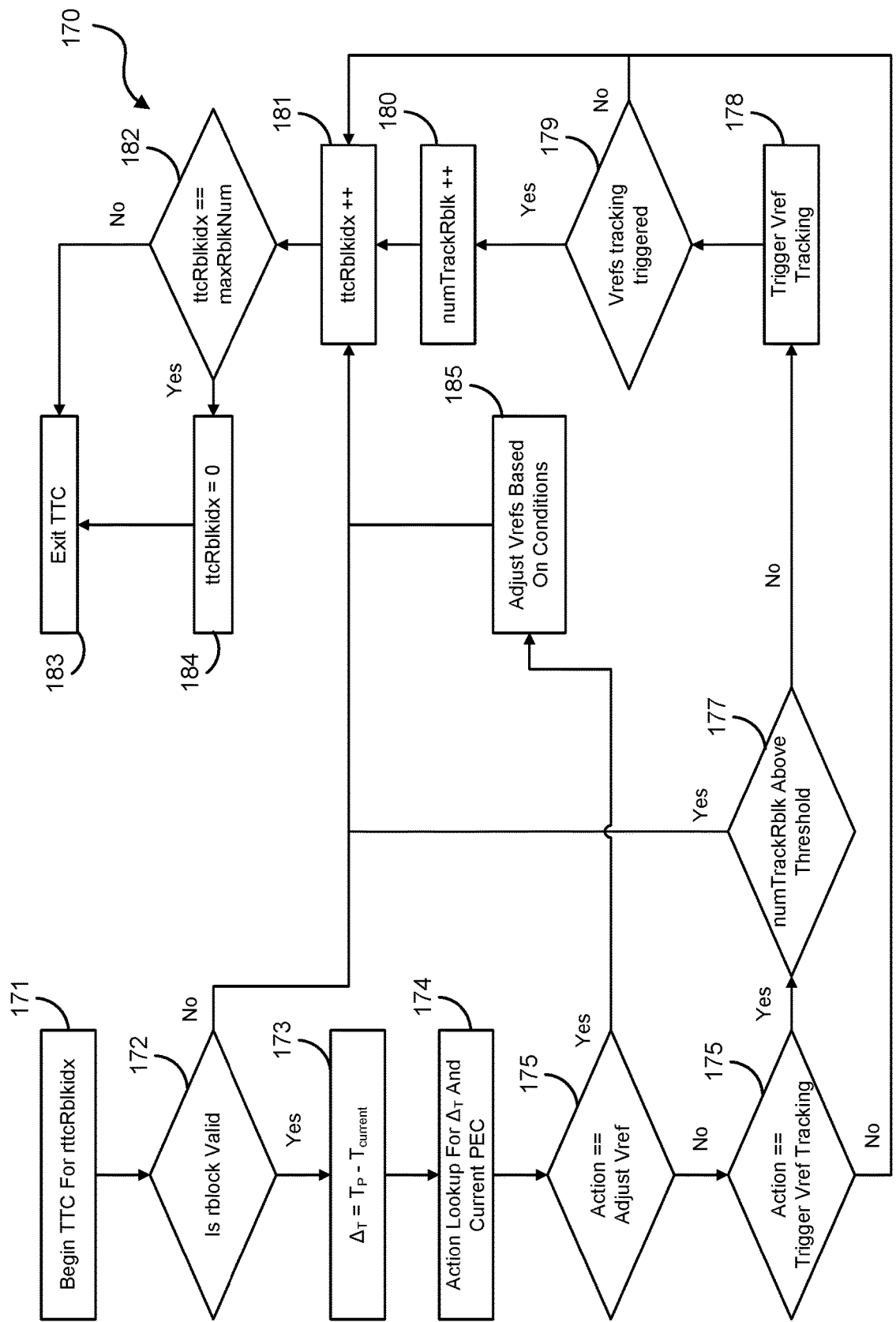
FIG. 9 is a flowchart of a process of an exemplary TTC background scan.

FIG. 9 is a flowchart of a process 170 of an exemplary TTC background scan. In this embodiment, the controller initiates the TTC based on the TTC index of the rblock, ttcRblkidx, in the process element 171. Once initiated, the controller 20 may determine whether the rblock is valid, in the process element 172. For example, the controller 20 may determine whether the rblock under evaluation is not undergoing a PEC, has been erased, has been retired (e.g., a bad block), etc. If the rblock is not valid, the controller 20 may skip the rblock and increment the TTC index of the rblock, ttcRblkidx, in the process element 181. If, however, the rblock is valid, then the controller 20 may establish a change in temperature, ΔT, based on the temperature at the time of programming, $T_P$, minus the current temperature in which a storage device 30 is operating, $T_{current}$, in the process element 173.

The controller 20 may then access an action lookup table that determines whether the change in temperature, ΔT, and the current PEC warrants the adjustment of a Vref for the rblock, in the process element 174. For example, since the storage device 30 may be implemented in a variety of ways with differing operational and design characteristics, different Vrefs may be used depending on the storage device 30 being controlled by the controller 20. And, these Vrefs may be dependent upon a change in temperature, ΔT, between the last time from programming, $T_p$, and the current time, $T_{current}$. Thus, the lookup table may be configured with a priori Vref data based on the change in temperature, ΔT, relevant to the particular storage device 30. In this regard, the controller 20 may determine whether the action requires an adjustment to the Vref, in the process element 175. One example of a lookup table is illustrated in Table 1.

TABLE 1

| ΔT | Action for PEC [0-500] |
|---|---|
| −∞ to −50 degrees | Trigger Vref tracking |
| −50 to −40 degrees | Trigger Vref tracking |
| ... | |
| −10 to 0 degrees | No action |
| 0 to 10 degrees | No action |
| 10 to 20 degrees | No action |
| 20 to 30 degrees | Adjust to Vrefs ($V_{11}, V_{21}, \ldots, V_{N1}$) |
| 30 to 40 degrees | Adjust to Vrefs ($V_{11}, V_{22}, \ldots, V_{N2}$) |
| 40 to 50 degrees | Trigger Vref tracking |
| 50 to ∞ degrees | Trigger Vref tracking |

In this example, Table 1 illustrates the actions to be taken by the controller 20 when an rblock under evaluation has a PEC of 0 to 500. For example, the controller 20 may keep track of the number of times a PEC is performed on an rblock. In this example, the rblock under evaluation has had anywhere from 0 to 500 PECs performed, which may change the way storage device 30 operates according to changes in operating temperature (e.g., ΔT). In this regard, the controller 20 may change how Vrefs are applied to correctly read stored data. Thus, in this example, when the change in temperature, ΔT, is −∞ to −50 degrees, the controller 20 may trigger adaptive Vref tracking. In some instances (e.g., −10 to 20 degrees), no action is required. In other instances (e.g., 20 to 40 degrees), the controller 20 may apply predetermined Vrefs (e.g., the Vrefs $V_{11}, V_{21}, \ldots, V_{N1}$ and $V_{12}, V_{22}, \ldots, V_{N2}$, where the reference "N" is an integer greater than "1" and not necessarily equal to any other "N" reference herein). Other blocks with different PECs may use different action lookup tables.

If a Vref adjustment is deemed necessary, the controller 20 may adjust the Vrefs for the rblock based on the operating conditions of the storage device 30, in the process element 185, and increment the TTC index of the rblock, ttcRblkidx, in the process element 181. Otherwise, the controller 20 determines whether the action needs to trigger adaptive Vref tracking, in the process element 175. If Vref tracking is not needed, the controller 20 may skip the rblock and increment the TTC index of the rblock, ttcRblkidx, in the process element 181. Otherwise, the controller 20 may determine whether the number of rblocks tracked, numTrackRblk, during the background scan is above a certain threshold, in the process element 177 (e.g., to limit the number of background activities being performed such that other background and/or foreground activities can be performed).

If the numTrackRblk value is above the threshold, the controller 20 may skip the rblock and increment the TTC index of the rblock, ttcRblkidx, in the process element 181. If the numTrackRblk value is below the threshold, the controller 20 may trigger the Vref tracking, in the process element 178. From there, the controller 20 may determine whether Vref tracking is triggered, in the process element 179, for reasons mentioned above. If the Vref tracking is not triggered, the controller 20 may skip the rblock and increment the TTC index of the rblock, ttcRblkidx, in the process element 181. Otherwise, the controller 20 increments the numTrackRblk value, in the process element 180, and then increments the TTC index of the rblock, ttcRblkidx, in the process element 181.

Once the TTC index of the rblock, ttcRblkidx, has been incremented, in the process element 181, the controller 20 determines whether the TTC index of the rblock, ttcRblkidx, has reached a maximum number of rblocks on the die, maxRblkNum, to determine whether the controller 20 should move onto the next die, in the process element 182. If the TTC index of the rblock, ttcRblkidx, has reached the maximum number of rblocks on the die, maxRblkNum, the controller 20 initializes the TTC index of the rblock, ttcRblkidx, to zero (e.g., for the next die), in the process element 184, and then exits the TTC, in the process element 183. Otherwise, the controller 20 may simply exit the TTC scan, in the process element 183 (e.g., to reset the ttcRblk counter).

Figure 10:
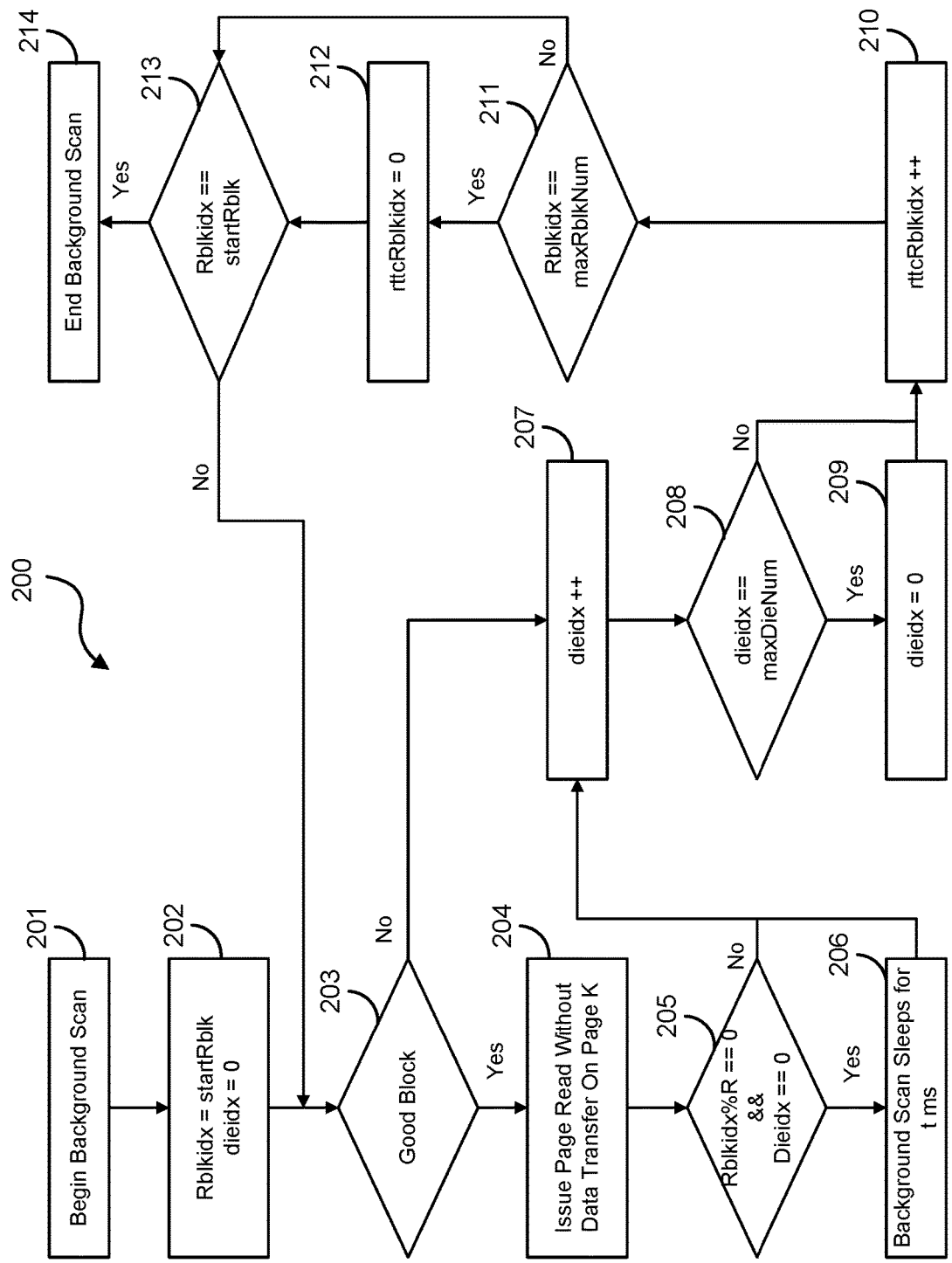
FIG. 10 is a flowchart of a process of an exemplary first read effect background scan.

FIG. 10 is a flowchart of a process 200 of an exemplary first read effect background scan. In this embodiment, the controller 20 begins the background scan, in the process element 201. Once initiated, the controller 20 may establish the rblock index of a die to a randomly generated starting point on the die, startRblk (i.e., a randomly selected rblock), in the process element 202. The controller 20 may then determine whether or not the rblock is a good block, in the process element 203. For example, rblocks that are retired, not storing data, currently being programmed, etc. may not need to be scanned. Accordingly, these blocks can be skipped and the controller 20 may increment the die index, dieidx, in the process element 207.

If the rblock under evaluation is a good block, the controller 20 may issue a page read without data transfer on page index K of the rblock ("K" again being a non-negative integer representing an index to the pages of the rblock under evaluation), in the process element 204, as described above. From there, the controller 20 may determine whether the Rblkidx % R equals zero and the die index, dieidx, equals zero, in the process element 205. Again, the Rblkidx % R is generally a value that tells the controller 20 how often the background scan is put to sleep such that other tasks (e.g., I/O operations, garbage collections, etc.) may run. If the conditions are met, the controller 20 may put the background scan to sleep for a programmable time, t, generally in milliseconds, in the process element 206. Then, the controller 20 may increment the die index, dieidx, and move onto the next die, in the process element 207. If the conditions are not met, the controller 20 may increment the die index, dieidx, and move onto the next die, in the process element 111, regardless.

With the die index, dieidx, incremented, the controller 20 may determine whether the die index, dieidx, is equal to the maximum die number of the storage device 30, maxDieNum, in the process element 208. If so, the controller 20 may increment the RTTC index of the rblock, rttcRblkidx, in the process element 210, and determine whether the RTTC index of the rblock, rttcRblkidx, has reached the maximum number of rblocks on the die, maxDieNum, in the process element 211. If the background scan has reached the maximum die number, maxDieNum, the controller 20 may reinitialize the die index, dieidx, to zero such that the background scan can begin anew (e.g., continue on the next rblock of the next die), in the process element 209. Otherwise, the controller 20 may increment the RTTC index of the rblock, rttcRblkidx, in the process element 210, and determine whether the RTTC index of the rblock, rttcRblkidx, has reached the maximum number of rblocks on the die, maxDieNum, in the process element 211.

If the RTTC index of the rblock, rttcRblkidx, has reached the maximum number of rblocks on the die, maxDieNum, the controller 20 may reinitialize the RTTC index of the rblock, rttcRblkidx, to zero, in the process element 212, so that the background scan can start anew (e.g., continue on the next rblock). If the RTTC index of the rblock, rttcRblkidx, has not reached the maximum number of rblocks on the die, maxDieNum, then the controller 20 may determine whether the rblock index, rblkidx, is evaluating the rblock in which the background scan initiated, in the process element 213 (i.e., startRblk). If not, the background scan continues by moving onto the next rblock to determine whether the next rblock is a good block, in the process element 203. If the rblock index, rblkidx, has reached the starting rblock, startRblk, then all of the rblocks in the die have been evaluated and the controller 20 ends the background scan, in the process element 214.

Figure 11:
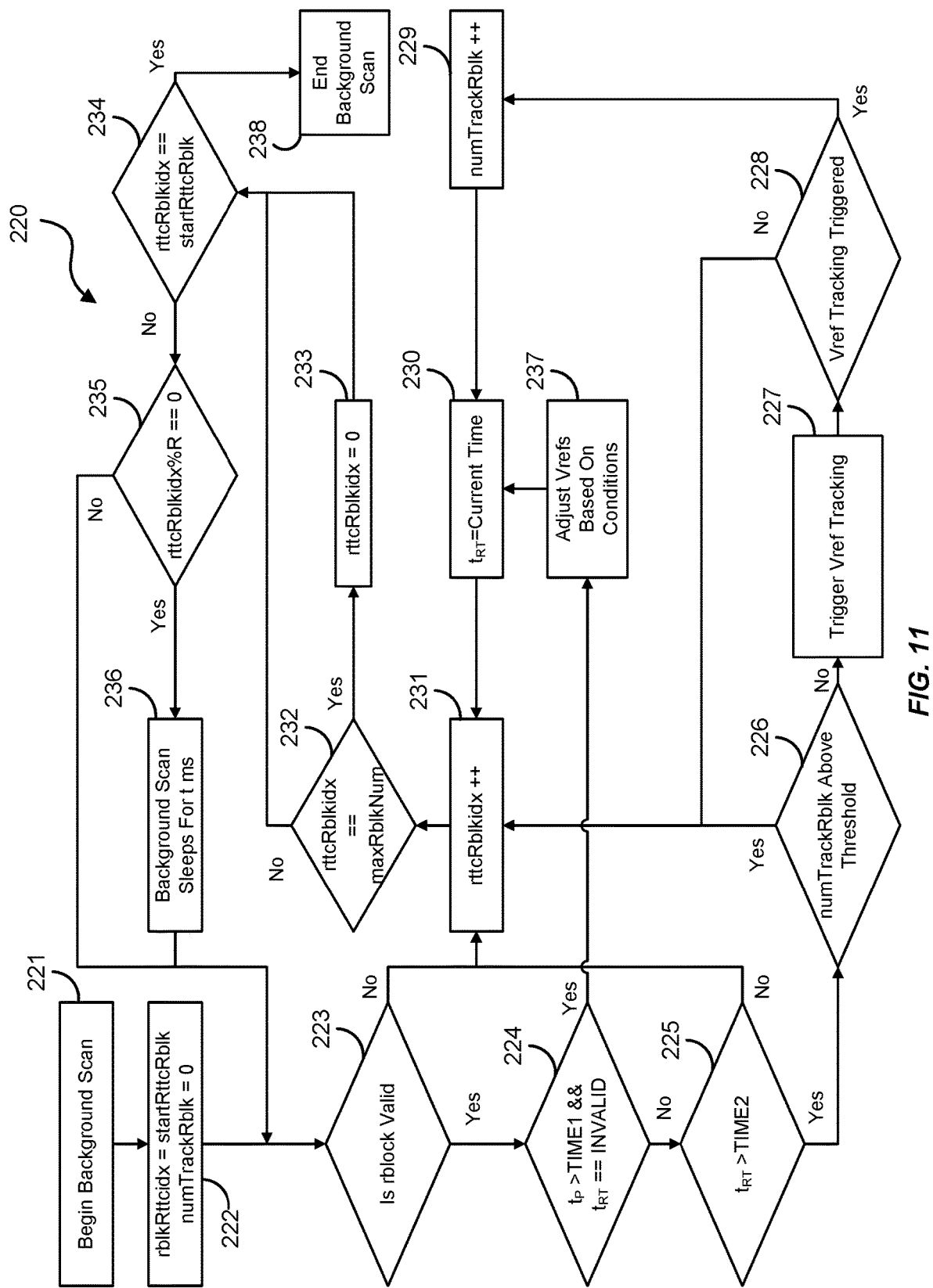
FIG. 11 is a flowchart of a process of an exemplary LTDR background scan.

FIG. 11 is a flowchart of a process 220 of an exemplary LTDR background scan. In this embodiment, the controller 20 initiates the background scan, in the process element 221 and initializes the background scan to ensure that each rblock is evaluated, in the process element 222. For example, the rblock's RTTC index, rblkRttcidx, may be initialized to a randomly generated startRttcRblk value, and the number of rblocks tracked during the background scan, numTrackRblk, may be initialized to zero. From there, the controller 20 may determine whether the rblock is valid, in the process element 223 (e.g., as described above). If not, the controller may increment the RTTC index of the rblock, rblkRttcidx, in the process element 231.

If the rblock is valid, then the controller 20 may determine whether the time, $t_P$, that the rblock was last programmed has breached a threshold time, TIME1, and whether the retention test time, $t_{RT}$, of the rblock is invalid, in the process element 224. For example, the time, TIME1, may represent the time after the programming threshold (e.g., $\sigma_p$). If these conditions are met, the controller 20 may adjust the Vrefs of the rblock under evaluation based on the operating conditions of the storage device 30, in the process element 237. The controller 20 may then set the time for the last retention test to be the current time, in the process element 230, and increment the RTTC index of the rblock, rttcRblkidx, in the process element 231, to move onto the next rblock.

If the $t_P$ and $t_{RT}$ conditions are not met, then the controller 20 may determine whether the retention test time, $t_{RT}$, of the rblock has breached a threshold time, TIME2, which may represent the time between two Vref adjustments (e.g., $\alpha(t_P)*\sigma_{RT}$), in the process element 225. If the retention test time, $t_{RT}$, of the rblock has not breached the threshold time, TIME2, then there is no reason to perform the RTTC background scan on that particular rblock. Accordingly, the controller 20 may increment the RTTC index of the rblock, rttcRblkidx, in the process element 231, to move onto the next rblock.

If the retention test time, $t_{RT}$, of the rblock has breached the threshold time, TIME2, then the controller 20 may determine whether the number of rblocks tracked, numTrackRblk, during the background scan is above a certain threshold, in the process element 226. Again, the numTrackRblk threshold may be used to limit the number of background activities being performed such that other background activities can be performed. If the numTrackRblk value is above the threshold, the controller 20 may increment the RTTC index of the rblock, rttcRblkidx, in the process element 231. If the numTrackRblk value is below the threshold, the controller 20 may trigger adaptive Vref tracking, in the process element 227. Then, the controller 20 may determine whether the Vref tracking has been triggered, in the process element 228. If it has not, the controller 20 may increment the RTTC index of the rblock, rttcRblkidx, in the process element 231, to move onto the next rblock. Otherwise, the controller 20 may increment the numTrackRblk, in the process element 229, and set the time for the last retention test to be the current time, in the process element 230. The controller 20 may then increment the RTTC index of the rblock, rttcRblkidx, in the process element 231, to move onto the next rblock.

Once the RTTC index of the rblock, rttcRblkidx, is incremented (e.g., the process element 231), the controller 20 may determine whether the RTTC index of the rblock, rttcRblkidx, has reached the maximum number of rblocks, maxRblkNum, in the process element 232. If so, the controller 20 may set the RTTC index of the rblock, rttcRblkidx, to zero, in the process element 233, to begin a process that may put the RTTC portion of the background scan to sleep or move onto the next rblock. For example, the controller 20 may then determine whether the RTTC index of the rblock, rttcRblkidx, is equal to the initial randomly generated startRttcRblk value, in the process element 234. Since it is not, the controller 20 may determine whether the rttcRblkidx % R equals zero, in the process element 235. The rttcRblkidx % R is generally a value that tells the controller 20 how often the RTTC portion of the background scan is put to sleep such that other tasks (e.g., I/O operations, garbage collections, etc.) may run. If the rttcRblkidx % R equals zero, the controller 20 may put the background scan to sleep for a certain amount of time (usually in milliseconds), in the process element 236. From there, the controller 20 may wake up the background scan and start on the next rblock by determining whether it is valid, in the process element 223. If the rttcRblkidx % R does not equal zero, then there is no reason to put the background scan to sleep, and the background scan moves on to the next rblock to determine its validity, in the process element 223.

If the RTTC index of the rblock, rttcRblkidx, has not reached the maximum number of rblocks, maxRblkNum, in the process element 232, the controller 20 may determine whether the RTTC index of the rblock, rttcRblkidx, is equal to the initial randomly generated startRttcRblk value, in the process element 234. If so, all of the rblocks on the die have been evaluated, and the background scan ends, in the process element 238. Otherwise, the controller 20 puts the background scan to sleep and/or moves on to the next rblock (e.g., via process elements 235 and 236).

Figure 12:
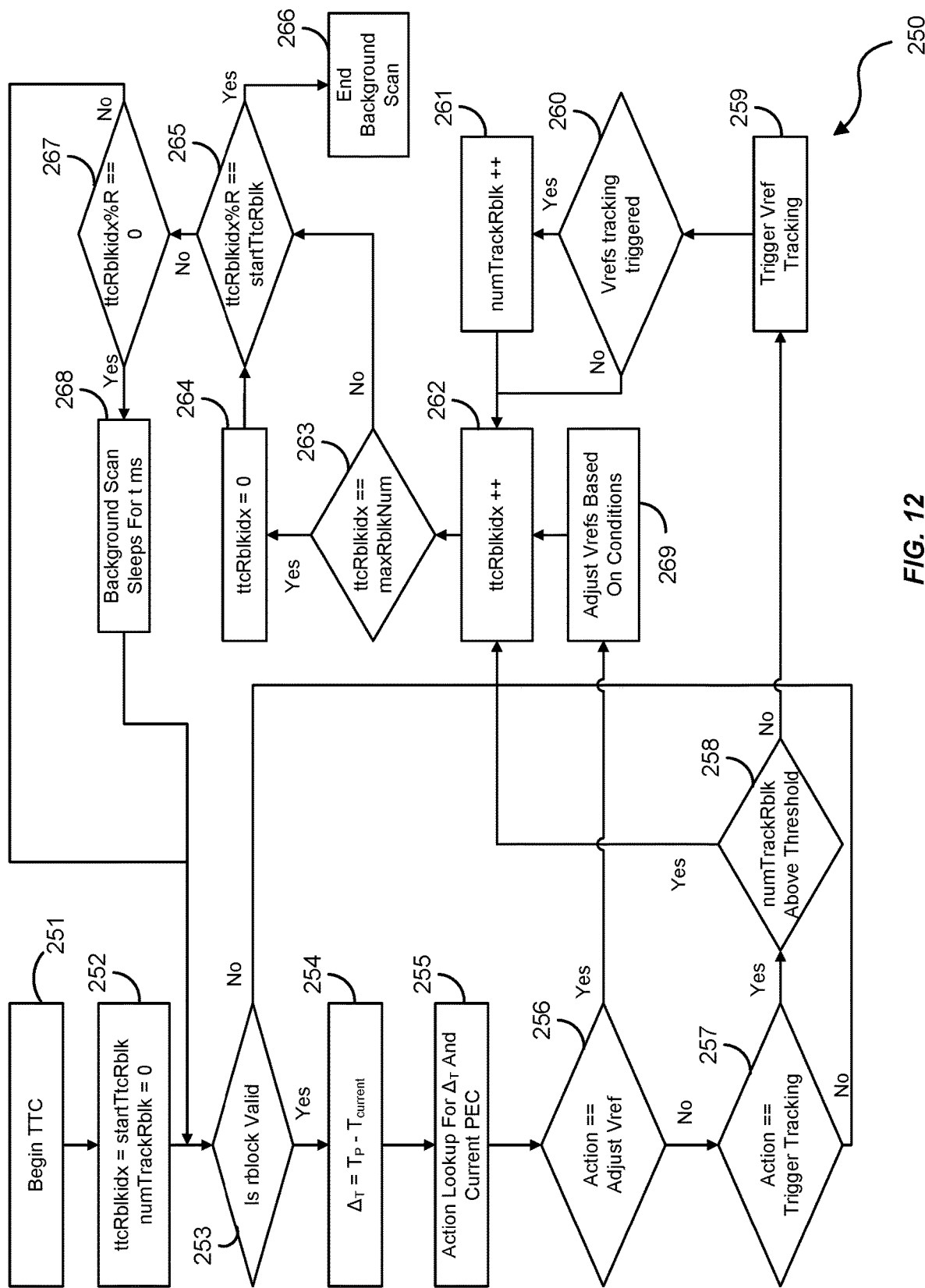
FIG. 12 is a flowchart of a process of an exemplary cross temperature background scan.

FIG. 12 is a flowchart of a process 250 of an exemplary cross temperature background scan. In this embodiment, the controller 20 initiates the TTC background scan, in the process element 251. In doing so, the controller 20 may initialize the TTC index of the rblock, ttcRblkidx, to a randomly generated startTtcRblk value with the number of rblocks tracked during the background scan, numTrackRblk, being initialized to zero, in the process element 252. Then, the controller 20 may determine whether the rblock is valid, in the process element 253, as described above. If it is not, the controller 20 may increment the TTC index of the rblock, ttcRblkidx, to move onto the next rblock.

If the rblock is valid, then the controller 20 may establish a change in temperature, $\Delta T$ (e.g., the temperature at the time of programming, $T_P$, minus the current temperature in which a storage device 30 is operating, $T_{current}$), in the process element 254. The controller 20 may then access the aforementioned action lookup table that determines whether the change in temperature, $\Delta T$, and the current PEC warrants the adjustment of a Vref for the rblock, in the process element 255. Again, Vrefs may be dependent upon change in temperature, $\Delta T$, between the temperature at programming, $T_P$, and the current temperature, $T_{current}$. Thus, the controller 20 may determine whether the action requires an adjustment to the Vref, in the process element 256.

If a Vref adjustment is deemed necessary, the controller 20 adjusts the Vrefs for the rblock based on the operating conditions of the storage device 30, in the process element 269, and increments the TTC index of the rblock, ttcRblkidx, in the process element 262. Otherwise, the controller 20 determines whether the action needs to trigger adaptive Vref tracking, in the process element 257. If Vref tracking is not needed, the controller 20 may skip the rblock and increment the TTC index of the rblock, ttcRblkidx, in the process element 262. Otherwise, the controller 20 may determine whether the number of rblocks tracked, numTrackRblk, during the background scan is above a certain threshold, in the process element 258 (e.g., to limit the number of background activities being performed such that other background activities can be performed).

If the numTrackRblk value is above the threshold, the controller 20 may skip the rblock and increment the TTC index of the rblock, ttcRblkidx, in the process element 262. If the numTrackRblk value is below the threshold, the controller 20 may trigger the Vref tracking, in the process element 259. From there, the controller 20 may determine whether Vref tracking is triggered, in the process element 260, for reasons described above. If the Vref tracking is not triggered, the controller 20 may skip the rblock and increment the TTC index of the rblock, ttcRblkidx, in the process element 262. Otherwise, the controller 20 increments the numTrackRblk value, in the process element 261, and then increments the TTC index of the rblock, ttcRblkidx, in the process element 262.

Once the TTC index of the rblock, ttcRblkidx, is incremented (e.g., the process element 262), the controller 20 may determine whether the TTC index of the rblock, ttcRblkidx, has reached the maximum number of rblocks, maxRblkNum, in the process element 263. If so, the controller 20 may set the TTC index of the rblock, ttcRblkidx, to zero, in the process element 264, to begin a process that may put the TTC portion of the background scan to sleep or move onto the next rblock. For example, the controller 20 may then determine whether an index ttcRblkidx % R is equal to the initial randomly generated startTtcRblk value, in the process element 265. The controller 20 may then determine whether the ttcRblkidx % R equals zero, in the process element 267. The ttcRblkidx % R is generally a value that tells the controller 20 how often the TTC portion of the background scan is put to sleep such that other tasks (e.g., I/O operations, garbage collections, etc.) may run. This may be a preset configuration in firmware to force the task to sleep every certain number of rblocks to ensure that other processes may run. If the ttcRblkidx % R equals zero, the controller 20 may put the background scan to sleep for a certain amount of time (usually in milliseconds), in the process element 268. From there, the controller 20 may wake up the background scan and start on the next rblock by determining whether it is valid, in the process element 253. If the ttcRblkidx % R does not equal zero, then there is no reason to put the background scan to sleep, and the background scan moves on to the next rblock to determine its validity, in the process element 253.

If the TTC index of the rblock, ttcRblkidx, has not reached the maximum number of rblocks, maxRblkNum, in the process element 263, the controller 20 may determine whether the TTC index of the rblock, ttcRblkidx, is equal to the initial randomly generated startTtcRblk value, in the process element 265. If so, all of the rblocks on the die have been evaluated, and the background scan ends, in the process element 266. Otherwise, the controller 20 puts the background scan to sleep and/or moves on to the next rblock (e.g., via the process elements 268 and 253).

In any of the embodiments shown and described hereinabove, the time thresholds may be programmable in firmware and changeable throughout the life of the storage device 30 taking into consideration PECs, operating temperatures, read disturb counts, flash conditions, or the like. In some embodiments, these thresholds are empirical in nature and based on observations of similar devices. In some embodiments, the thresholds are based on a given workload of how many rblocks would need to be tracked, how long Vref tracking would take, etc. This may be implemented as a safeguard to be sure that the controller 20 does not put a scan in an idle mode while Vref tracking is being performed, particularly when there are rblocks in which Vrefs could be adjusted in little time. Such an implementation may be hardware, firmware, and/or flash type dependent and/or based on other operating conditions. In some embodiments, the controller 20 triggers a full adaptive tracking feature once the Vrefs are proactively adjusted but such may depend on the flash type or the current drive condition. In some embodiments, the controller 20 may wake up the background scans to scan the entire storage device 30. Alternatively or additionally, the controller 20 may wake up the background scans to scan between reads to scan a portion of the storage device 30 (e.g., individual pages, blocks, etc.).

Figure 13:
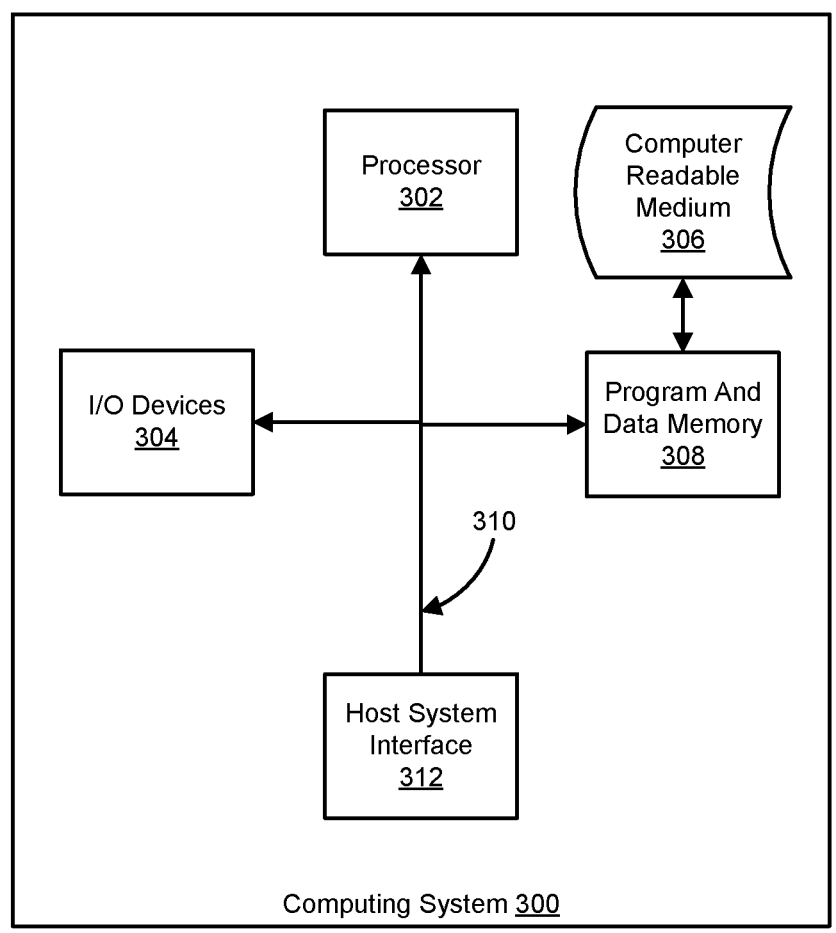
FIG. 13 is a block diagram of an exemplary computing system in which a computer readable medium provides instructions for performing methods herein.

The embodiments herein may be combined in a variety of ways as a matter of design choice. Accordingly, the features and aspects herein are not intended to be limited to any particular embodiment. Furthermore, the embodiments can take the form of hardware, firmware, software, or combinations thereof. In one embodiment, such software includes but is not limited to firmware, program code, resident software, microcode, etc. FIG. 13 illustrates a computing system 300 in which a computer readable medium 306 may provide instructions for performing any of the methods and processes disclosed herein.

Furthermore, some aspects of the embodiments herein can take the form of a computer program product accessible from the computer readable medium 306 to provide program code for use by or in connection with a computer or any instruction execution system. For the purposes of this description, the computer readable medium 306 can be any apparatus that can tangibly store the program code for use by or in connection with an instruction execution system, apparatus, or device, including the computing system 300.

The computer readable medium 306 can be any tangible electronic, magnetic, optical, electromagnetic, infrared, or semiconductor system (or apparatus or device). Some examples of a computer readable medium 306 include solid state memories, magnetic tapes, removable computer diskettes, random access memories (RAM), read-only memories (ROM), magnetic disks, and optical disks. Some examples of optical disks include read only compact disks (CD-ROM), read/write compact disks (CD-R/W), and digital versatile disks (DVD).

The computing system 300 can include one or more processors 302 coupled either directly or indirectly to memory 308 through a system bus 310. The memory 308 can include local memory employed during actual execution of the program code, bulk storage, and/or cache memories, which provide temporary storage of at least some of the program code in order to reduce the number of times the code is retrieved from bulk storage during execution.

Input/output (I/O) devices 304 (including but not limited to storage devices, keyboards, displays, pointing devices, etc.) can be coupled to the computing system 300 either directly or through intervening I/O interfaces, such as Small Computer System Interface (SCSI) interfaces, Serial AT Attachment (SATA) interfaces, Serial Attached SCSI (SAS), Peripheral Component Interconnect (PCI) and PCI Express (PCIe) interfaces, Universal Serial Bus (USB) interfaces, Ethernet interfaces, WiFi interfaces, Bluetooth interfaces, to name a few. Network adapters can also be coupled to the computing system 300 to enable the computing system 300 to couple to other data processing systems (e.g., through host system interface 312), printers, and/or storage devices through intervening private or public networks. Modems, cable modems, and Ethernet cards are just a few examples of network adapter types.

What is claimed is:

1. A storage system, comprising:
a storage device comprising a plurality of storage areas operable to store data; and
a controller operable to evaluate operating conditions of the storage device, to track a time of last programming and a time of last retention test associated with each the plurality of storage areas, to perform a background scan on a first storage area of the plurality of storage areas, to read at least a portion of the first storage area without data transfer based on the tracked time of last programming of the first storage area, and to adjust a reference voltage for the first storage area based on the tracked time of last programming and tracked time of last retention test of the first storage area and the operating conditions of the storage device, wherein adjusting the reference voltage for the first storage area based on the tracked time of last programming and tracked time of last retention test of the first storage area comprises adjusting the reference voltage for the first storage area after a second threshold amount of time since the reference voltage has been adjusted.

2. The storage system of claim 1, wherein reading the at least a portion of the first storage area without data transfer based on the tracked time of last programming of the first storage area comprises:
reading at least one page of a block of the first storage area after a first threshold amount of time has passed since the time of last programming of the first storage area.

3. The storage system of claim 1, wherein the controller is further operable to:
track a temperature of the storage device when the first storage area was programmed;
upon performing the background scan on a first storage area, determine a current temperature of the storage device; and adjust the reference voltage based on a comparison of the current temperature and the tracked temperature of the storage device when the first storage area was programmed.

4. The storage system of claim 3, wherein the controller is further operable to access a lookup table to determine how to adjust the reference voltage based on the comparison of the current temperature and the tracked temperature of the storage device when the first storage area was programmed and a number of program erase cycles performed on the first storage area.

5. The storage system of claim 1, wherein: the storage device is a three-dimensional NAND flash device.

6. A method, comprising:
evaluating operating conditions of a storage device comprising a plurality of storage areas operable to store data;
tracking a time of last programming and a time of last retention test associated with each the plurality of storage areas;
performing a background scan on a first storage area of the plurality of storage areas; reading at least a portion of the first storage area without data transfer based on the tracked time of last programming of the first storage area; and adjusting a reference voltage of the first storage area based on the tracked time of last programming and tracked time of last retention test of the first storage area and the operating conditions of the storage device, wherein adjusting the reference voltage for the first storage area based on the tracked time of last programming and tracked time of last retention test of the first storage area comprises adjusting the reference voltage for the first storage area after a second threshold amount of time since the reference voltage has been adjusted.

7. The method of claim 6, wherein reading the at least a portion of the first storage area without data transfer based on the tracked time of last programming of the first storage area comprises:
reading at least one page of a block of the first storage area after a first threshold amount of time has passed since the time of last programming of the first storage area.

8. The method of claim 6, wherein the method further comprises:
tracking a temperature of the storage device when the first storage area was programmed;
upon performing the background scan on a first storage area, determining a current temperature of the storage device; and
adjusting the reference voltage based on a comparison of the current temperature and the tracked temperature of the storage device when the first storage area was programmed.

9. The method of claim 8, further comprising:
accessing a lookup table to determine how to adjust the reference voltage based on the comparison of the current temperature and the tracked temperature of the storage device when the first storage area was programmed and a number of program erase cycles performed on the first storage area.

10. The method of claim 6, wherein: the storage device is a three-dimensional NAND flash device.

11. A non-transitory computer readable medium, comprising instructions that, when executed by a controller of a storage system, direct the controller to:
evaluate operating conditions of a NAND flash storage device comprising a plurality of storage areas operable to store data;
track a time of last programming and a time of last retention test associated with each the plurality of storage areas;
perform a background scan on a first storage area of the plurality of storage areas;
read at least a portion of the first storage area without data transfer based on the tracked time of last programming of the first storage area; and
adjust a reference voltage of the first storage area based on the tracked time of last programming and tracked time of last retention test of the first storage area and the operating conditions of the storage device, wherein adjusting the reference voltage for the first storage area based on the tracked time of last programming and tracked time of last retention test of the first storage area comprises adjusting the reference voltage for the first storage area after a second threshold amount of time since the reference voltage has been adjusted.

12. The non-transitory computer readable medium of claim 11, wherein reading the at least a portion of the first storage area without data transfer based on the tracked time of last programming of the first storage area comprises:
reading at least one page of a block of the first storage area after a first threshold amount of time has passed since the time of last programming of the first storage area.

13. The non-transitory computer readable medium of claim 11, further comprising instructions that direct the controller to:
track a temperature of the NAND flash storage device when the first storage area was programmed;
upon performing the background scan on a first storage area, determine a current temperature of the NAND flash storage device; and
adjust the reference voltage based on a comparison of the current temperature and the tracked temperature of the NAND flash storage device when the first storage area was programmed.

14. The non-transitory computer readable medium of claim 13, further comprising instructions that direct the controller to:
access a lookup table to determine how to adjust the reference voltage based on the comparison of the current temperature and the tracked temperature of the NAND flash storage device when the first storage area was programmed and a number of program erase cycles performed on the first storage area.

15. The storage system of claim 1, wherein the second threshold amount of time is calculated from a programmable threshold value and a multiple of the tracked time of last programming of the first storage area.

16. The method of claim 6, wherein the second threshold amount of time is calculated from a programmable threshold value and a multiple of the tracked time of last programming of the first storage area.

17. The non-transitory computer readable medium of claim 11, wherein the second threshold amount of time is calculated from a programmable threshold value and a multiple of the tracked time of last programming of the first storage area.

* * * * *